(12) United States Patent
Suganuma et al.

(10) Patent No.: US 7,067,817 B2
(45) Date of Patent: Jun. 27, 2006

(54) RADIATION IMAGE SENSOR AND MAKING METHOD OF SAME

(75) Inventors: Masahiro Suganuma, Hamamatsu (JP); Takaharu Suzuki, Hamamatsu (JP); Harumichi Mori, Hamamatsu (JP); Masahiko Honda, Hamamatsu (JP); Toshio Takabayashi, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 183 days.

(21) Appl. No.: 10/766,311

(22) Filed: Jan. 29, 2004

(65) Prior Publication Data

US 2005/0167604 A1    Aug. 4, 2005

(51) Int. Cl.
*G01T 1/20* (2006.01)
(52) U.S. Cl. .............................. 250/370.11; 250/370.08
(58) Field of Classification Search ........... 250/370.11, 250/370.08, 370.09, 484.4
See application file for complete search history.

(56) References Cited

U.S. PATENT DOCUMENTS 6,608,299 B1 *  8/2003  Kozuka .................... 250/214.1
6,867,418 B1 *  3/2005  Suzuki et al. ................ 250/368
6,891,164 B1 *  5/2005  Suzuki .................... 250/370.11
6,940,072 B1 *  9/2005  Homme et al. ......... 250/370.11
6,949,750 B1 *  9/2005  Tsutsui et al. ......... 250/370.11
6,963,070 B1 * 11/2005  Okada et al. ................ 250/367
6,965,111 B1 * 11/2005  Endo ..................... 250/370.11

FOREIGN PATENT DOCUMENTS

| JP | 5-196742 | 8/1993 |
| JP | 2000-048870 | 2/2000 |
| JP | 3029873 | 2/2000 |
| JP | 3077941 | 6/2000 |
| JP | 3405706 | 3/2003 |

\* cited by examiner

*Primary Examiner*—Otilia Gabor
(74) *Attorney, Agent, or Firm*—Drinker Biddle & Reath LLP

(57) ABSTRACT

An image sensor assembly is mounted and fixed on a mount substrate with an adhesive, and a light sensitive portion of the image sensor assembly is located so as to reach the vicinity of at least one peripheral region. A moisture-proof protective film to cover a scintillator layer of the image sensor assembly is laid so as to cover the scintillator layer over a side wall to which the light sensitive portion is in proximity, up to the back side of a substrate of the image sensor assembly, and this portion on the back side is sandwiched between the image sensor assembly and the mount substrate so as to be fixed.

5 Claims, 17 Drawing Sheets

RADIATION IMAGE SENSOR AND MAKING METHOD OF SAME

BACKGROUND OF THE INVENTION

1. Technical Field

The present invention relates to a radiation image sensor for capturing a radiation image in the form of image data and, more particularly, to a radiation image sensor capable of detecting an image to an edge thereof, which is applied to mammography and others, and to a making method of them.

2. Background Art

In the medical and industrial radiography, radiation imaging systems using a radiation detector instead of X-ray sensitive film have widely used in recent years. Such radiation imaging systems require no development as the X-ray sensitive film, are highly convenient, for example, in that one can check a radiation image in real time, and are also advantageous in terms of storageability of data and facility to handle.

A common radiation imaging system is configured to convert an incident radiation image into visible light or the like (including ultraviolet and infrared rays) by a scintillator, to detect the light image after the conversion by one-dimensionally or two-dimensionally arrayed photosensors, and to output an electric signal corresponding to the image data. CsI as a typical scintillator material is a hygroscopic material and has a property of absorbing water vapor (moisture) in air to dissolve. For this reason, it is necessary to provide a protective film for shielding the scintillator from the atmosphere, in order to prevent degradation of the characteristics due to the absorption of moisture.

JP 5-196742A (document 1) discloses an example of such technology in which a water-impermeable moisture barrier is formed above a scintillator layer to protect the scintillator from moisture.

SUMMARY OF THE INVENTION

Incidentally, it is said that it is effective for early detection of mammary cancer to adopt the mammography of placing the mammary between plates and taking an X-ray image thereof, in combination with palpation. In this mammography, it is necessary to capture an accurate X-ray image of the mammary up to the base part thereof, and to capture an image in high resolution with small X-ray dose. Therefore, the proliferation of the radiation imaging systems is slower than in the other fields. Particularly, reflection, refraction, pan and zoom of image with an optical system are not available to X-rays, different from visible light. Therefore, in order to accurately capture the X-ray image up to the base part of the mammary with the radiation imaging system, there is no option but to place the scintillator and image pickup device in close proximity to the base part. This means that the scintillator and image pickup device have to be located in at least one peripheral region of the imaging sensor, but in this structure, it is difficult to form the moisture barrier as in the technology of Document 1.

Therefore, it is an object of the present invention to provide a radiation image sensor with an image sensor panel in structure capable of detecting a radiation image up to at least one peripheral region, while securing moisture resistance for the scintillator.

In order to solve the above problem, a radiation image sensor according to the present invention is a radiation image sensor in which an image sensor assembly is placed on a mount substrate, wherein the image sensor assembly comprises: (1) a sensor substrate of flat plate shape having a first surface and a second surface as front and back sides; (2) a light receiving portion comprising a plurality of photoelectric conversion elements two-dimensionally arranged on the first surface of the sensor substrate and in proximity to at least one edge thereof; (3) a scintillator formed on at least a surface of the light receiving portion, the scintillator outputting light of a wavelength that can be detected by the photoelectric conversion elements, in accordance with an incident radiation; (4) a resin layer placed in a surrounding area around the scintillator except for the edge to which the light receiving portion is in proximity, on the first surface of the sensor substrate; and (5) a protective film continuously and integrally covering a region from a surface of the scintillator via a side wall portion of the sensor substrate on a side of the edge to which the light receiving portion is in proximity, to the second surface, the protective film having a peripheral part fixed on sides except for the edge to which the light receiving portion is in proximity, by the resin layer, wherein the protective film on the second surface is sandwiched between the mount substrate and the sensor substrate so as to be fixed.

In the radiation image sensor according to the present invention, the light receiving portion, which comprises the photoelectric conversion elements placed in proximity to at least one edge of the sensor substrate, functions as effective pixels up to the extreme end of this peripheral region. The scintillator is protected as covered by the protective film. The scintillator is located by specific one to three edges on the sensor substrate, and the resin layer is provided between the scintillator and each edge to which the scintillator is not in proximity. This resin layer fixes the peripheral portion of the protective film. As relations between the peripheral portion and the resin layer, there are three types of conceivable forms: the peripheral portion is located on the resin layer; the resin layer is located on the peripheral portion; the peripheral portion is sandwiched between resin layers. On the side of the edge to which the scintillator is in proximity, the protective film extends over the side wall of that edge up to the back side (second surface) and is sandwiched there between the mount substrate and the sensor substrate so as to be fixed.

In a preferred configuration the mount substrate has a plurality of through holes penetrating the mount substrate from a mount surface for the image sensor assembly, to a back side thereof. These through holes are used to create a difference between air pressures respectively exerted on the first surface and on the second surface of the sensor substrate, whereby the sensor substrate is urged against the mount substrate.

In a preferred configuration the image sensor assembly is fixed on the mount substrate with an adhesive and the adhesive is placed so as to surround the through holes. In this configuration, the image sensor assembly is fixed with the adhesive while the sensor substrate is urged against the mount substrate by the pressure difference.

In a preferred configuration the adhesive is placed in a grid pattern on the mount surface of the mount substrate for the image sensor assembly. In this configuration the adhesive is appropriately placed between apertures of the through holes on the mount surface.

On the other hand, a method of production of a radiation image sensor according to the present invention is a method of producing the above-stated radiation image sensor, the method comprising the steps of: (1) preparing the image sensor assembly comprising a sensor substrate of flat plate shape having a first surface and a second surface as front and back sides, a light receiving portion comprising a plurality of photoelectric conversion elements two-dimensionally arranged on the first surface of the sensor substrate and in proximity to at least one edge thereof, and a scintillator deposited on at least a surface of the light receiving portion, the scintillator outputting light of a wavelength that can be detected by the photoelectric conversion elements, in accordance with an incident radiation; (2) forming a protective film continuously and integrally covering a region from a surface of the scintillator of the image sensor assembly via a side wall part of the sensor substrate on a side of the edge to which the light receiving portion is in proximity, to the second surface, and fixing a peripheral part on sides except for the edge to which the light receiving portion is in proximity, by a resin layer placed in a surrounding area around the scintillator except for the edge to which the light receiving portion is in proximity, on the first surface of the sensor substrate; and (3) fixing the image sensor assembly on the mount substrate in a state in which the protective film on the second surface of the image sensor assembly is sandwiched between the mount substrate and the sensor substrate, with the second surface of the image sensor assembly being directed toward a mount surface of the mount substrate.

According to the present invention, the peripheral edge of the protective film is fixed by the resin layer or is sandwiched between the mount substrate and the sensor substrate so as to be fixed, whereby the protective film can be effectively prevented from peeling from the peripheral edge. Therefore, the moisture resistance of the scintillator is improved. In addition, effective pixels can be located up to the extreme end of the peripheral region, and the scintillator in that region is suppressed from degrading there; therefore, in application to mammography, for example, an image can be captured at high resolution up to the base part of the mammary, which permits an accurate diagnosis to be made.

The mount substrate is provided with the through holes to make the air pressure on the front side of the mounted image sensor part higher than the air pressure on the back side, so that the image sensor part can be urged against the mount substrate so as to be fixed. This method can avoid imparting a strong mechanical force on the scintillator, whereby it is feasible to prevent damage of the scintillator and to increase the yield of products.

DESCRIPTION OF THE PREFERRED EMBODIMENTS

Figure 1:
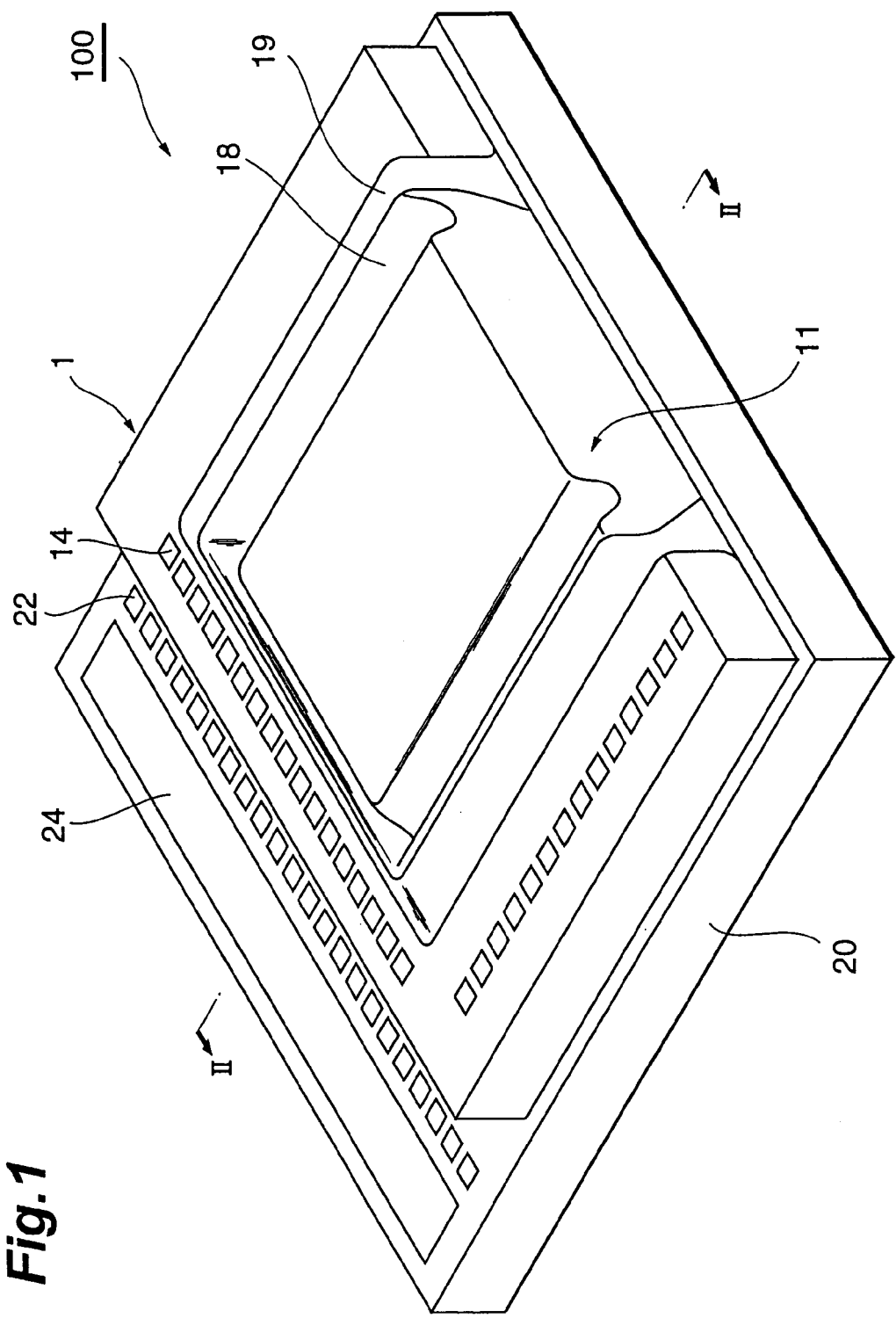
FIG. 1 is a front view showing a first embodiment of the radiation image sensor according to the present invention, and FIG. 2 a sectional view thereof.

The preferred embodiments of the present invention will be described below in detail with reference to the accompanying drawings. To facilitate the comprehension of the explanation, the same reference numerals denote the same parts, where possible, throughout the drawings, and a repeated explanation will be omitted.

Figure 2:
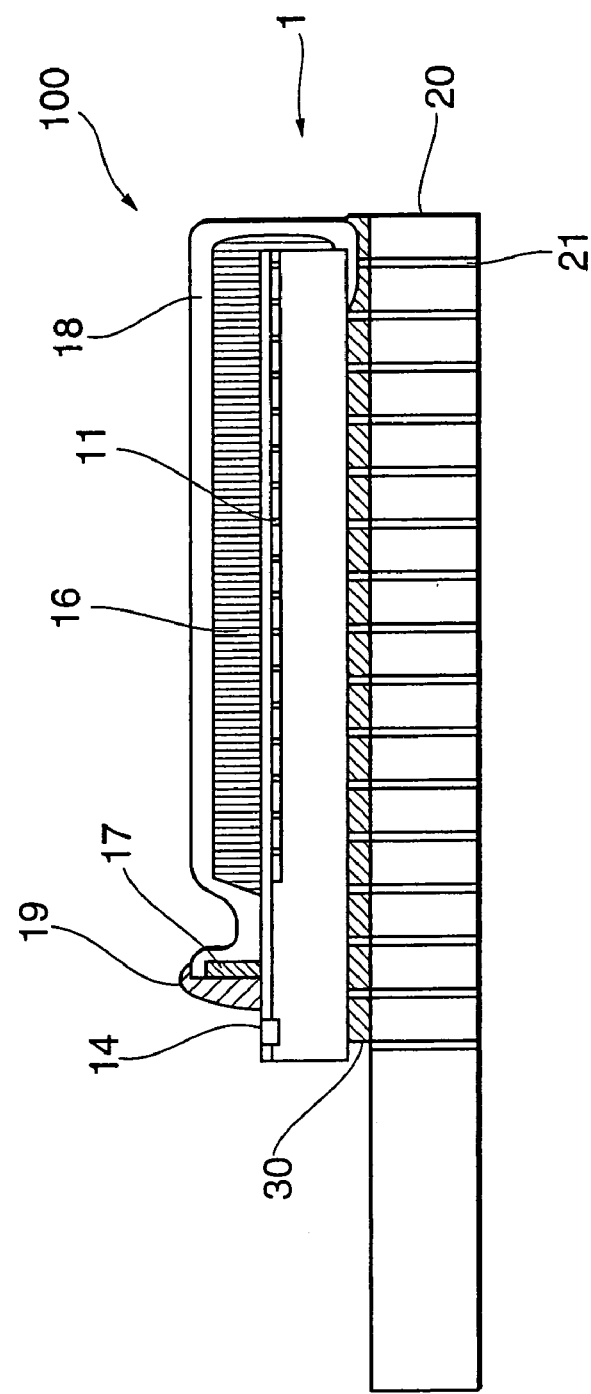
Figure 3:
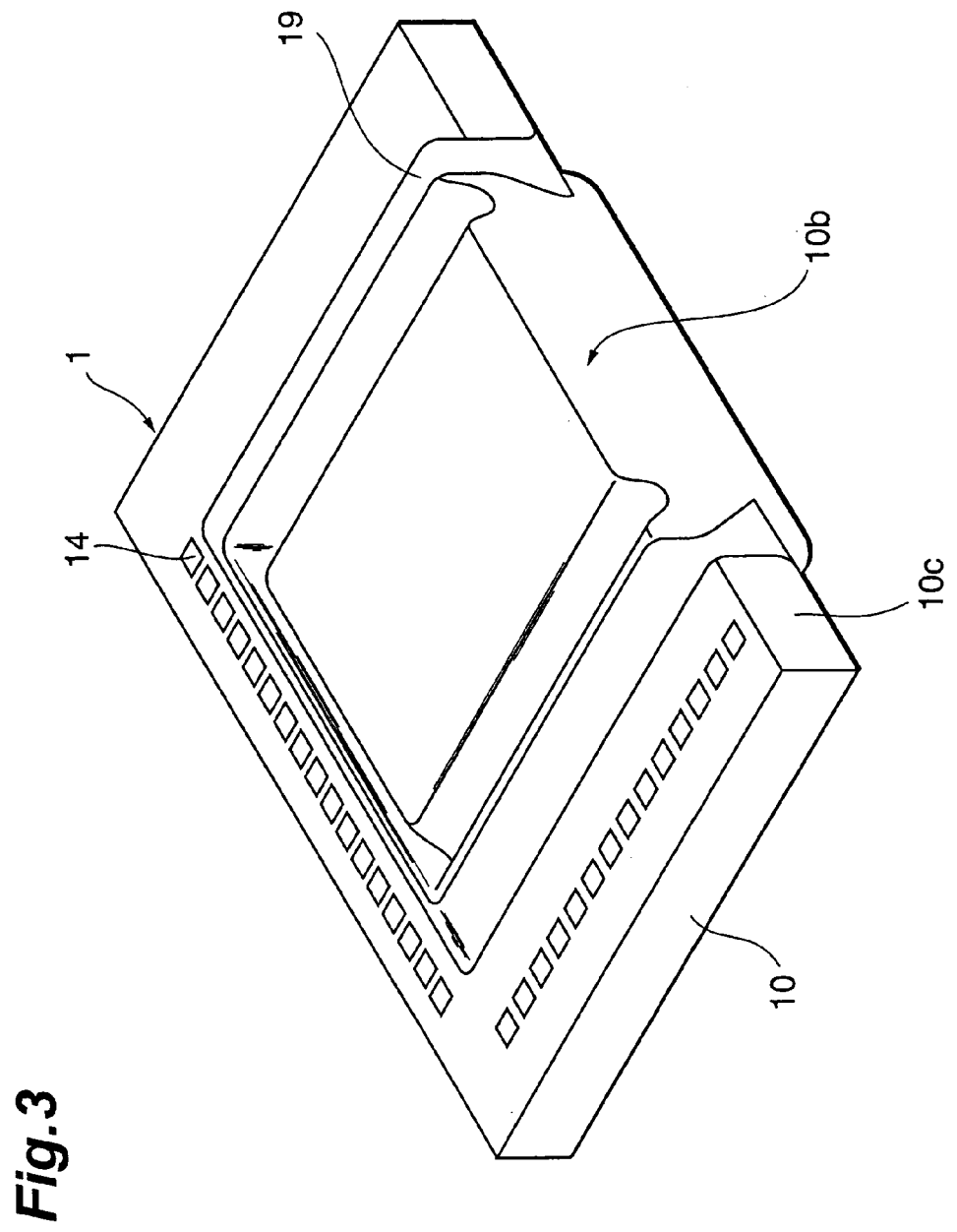
FIG. 3 is a perspective view of the image sensor assembly of the apparatus of FIG. 1, FIG. 4 a front view thereof.
Figure 4:
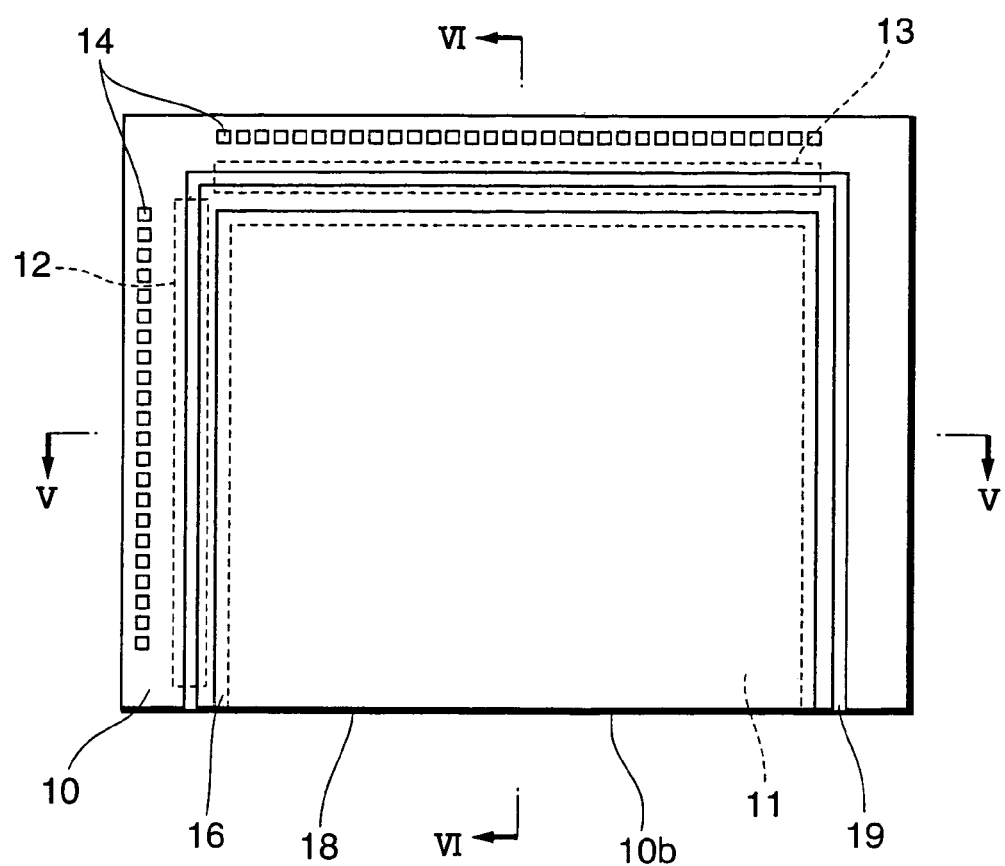
Figure 5:
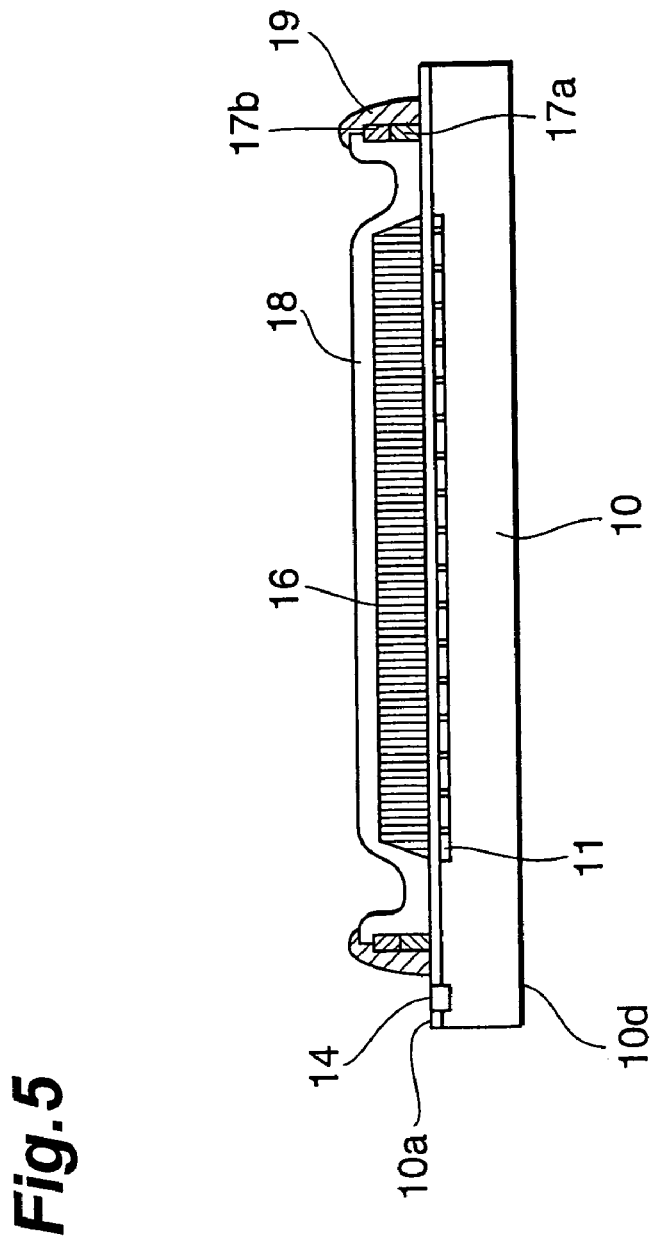
FIG. 5 and FIG. 6 are sectional views along line V—V and along line VI—VI, respectively, in FIG. 4.
Figure 6:
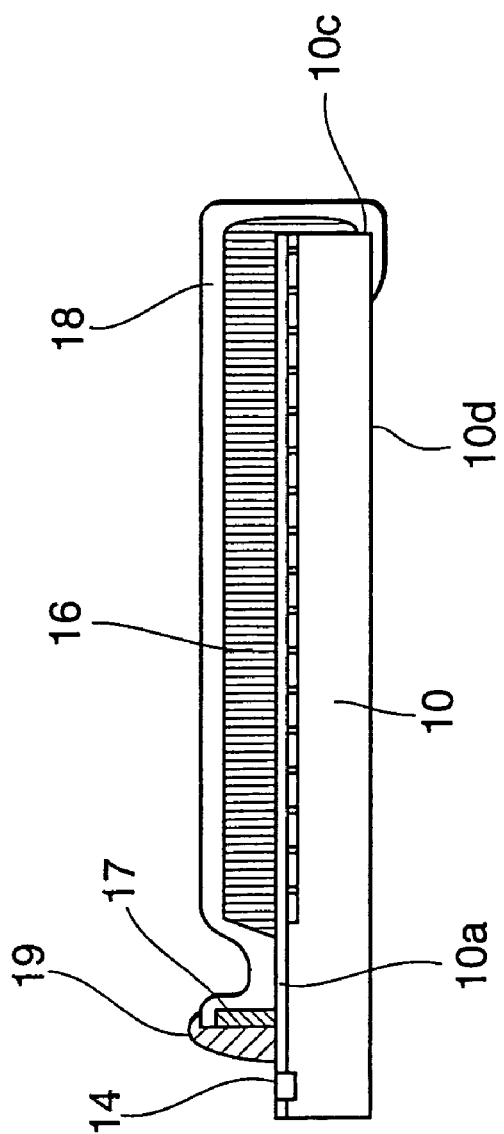

FIG. 1 is a front view showing a first embodiment of the radiation image sensor according to the present invention, and FIG. 2 a sectional view thereof. This radiation image sensor 100 is constructed in a configuration in which image sensor assembly 1 is mounted on mount substrate 20, and is one applied to mammography. FIG. 3 is a perspective view of image sensor assembly 1, FIG. 4 a front view thereof, FIG. 5 a sectional view thereof along line V—V, and FIG. 6 a sectional view thereof along line VI—VI.

In image sensor assembly 1, photodiodes for photoelectric conversion are two-dimensionally arranged to form light sensitive portion 11 as a light receiving region, on one surface (hereinafter referred to as a first surface) 10a of Si substrate 10 (size: 231 mm×184 mm, thickness: 0.8 mm) of a rectangular flat plate. A MOSFET (metal oxide semiconductor field-effect transistor) for controlling charge readout from a photodiode is placed corresponding to each photodiode. In the present embodiment the light sensitive portion 11 is located in proximity to one edge 10b of the Si substrate 10 and has a large image plane of approximately 220 mm×180 mm.

In a region around the light sensitive portion 11 formed on the first surface 10a of the Si substrate 10, a shift register 12 and a charge amplifier array 13 are located, and bonding pad portions 14 are located along two edges of the substrate off the light sensitive portion 11. The shift register 12 is electrically coupled to each MOSFET by a wire (not shown) formed on Si substrate 10, and controls the operation thereof. The charge amplifier array 13 is electrically coupled to each photodiode through a MOSFET by a wire (not shown) formed on Si substrate 10, and amplifies an output signal from the photodiode to output the amplified signal. The charge amplifier array 13 is comprised of a plurality of amplifiers (charge amplifiers), and capacitor elements and switching elements coupled in parallel to the amplifiers.

Each bonding pad portion 14 is comprised of a plurality of bonding pads and is electrically coupled to corresponding charge amplifier array 13 or shift register 12 by wires not shown.

A scintillator layer 16 for converting radiation (e.g., X-rays) into light that can be detected by the light sensitive portion 11 (ultraviolet light, infrared light, or visible light) is directly deposited on the light sensitive portion 11. The scintillator layer 16 covers the entire surface of the light sensitive portion 11 and may cover even the region where the shift register 12 and the charge amplifier array 13 are formed, but is never laid up to on the bonding pad portions 14.

A variety of materials can be used for this scintillator layer 16, and a preferred material is Tl-doped CsI or the like with high efficiency of emission. This CsI layer is deposited in the form of a lot of columnar crystals (needle-like crystals) extending upward from the first surface 10a.

A resin layer 17 is formed in structure of a U-shaped frame opening on the side of edge 10b, around the scintillator layer 16 and on the first surface 10a. This resin layer 17 can be made of KJR651 or KE4897 available from Shin-Etsu Chemical Co., Ltd., TSE397 available from GE Toshiba Silicones, DYMAX625T available from Sumitomo 3M Ltd., etc., which are silicone resins. In addition to the silicone resins, a variety of insulating, moisture-proof resins can be used.

Since the scintillator layer 16 has the deliquescence property, the surface thereof is covered by moisture-proof protective film 18. This moisture-proof protective film 18 covers the entire surface of scintillator layer 16 and three edges of the protective film reach the top area of the resin layer 17. The protective film 18 extends over a side wall 10c of the substrate on the side of edge 10b to reach second surface 10d being the back side to the first surface 10a. In the region where the scintillator layer 16 is not formed, except for the top area of the resin layer 17, the moisture-proof protective film 18 is in close fit to the Si substrate 10, and the whole film is continuously and integrally formed.

This moisture-proof protective film 18 is preferably made of an organic film and particularly preferably made of a parylene-based resin; for example, poly-para-xylylene resins (trade name Parylene available from Three Bond Co., Ltd.), preferably poly-chloro-para-xylylene (trade name Parylene C available from Three Bond). A coating film of parylene has extremely low permeability to water vapor and gas, high water-shedding quality and chemical resistance, excellent electrical insulation even in a thin film, and a feature of being transparent to radiation and visible light, and is thus suitable as a coating film.

The peripheral edge of the moisture-proof protective film 18 is covered from above by coating resin layer 19. This coating resin layer 19 is made, for example, of an acrylic resin. The coating resin layer 19 simultaneously covers the resin layer 17 from the outside, and is in direct contact with the Si substrate 10 in the part of side wall 10c.

The mount substrate 20 is a flat plate of a ceramic material and has an area wider than the image sensor assembly 1. In the present embodiment, the size of the mount substrate is 248 mm×225.7 mm and the thickness 3.5 mm. The image sensor assembly 1 is placed as displaced so that side wall 10c on the aforementioned edge 10b side extends along one of side walls 20a of the mount substrate 20. In this case, the side wall 10c of the image sensor assembly 1 is preferably positioned approximately 1 mm inside from the side wall 20a of mount substrate 20.

Figure 12:
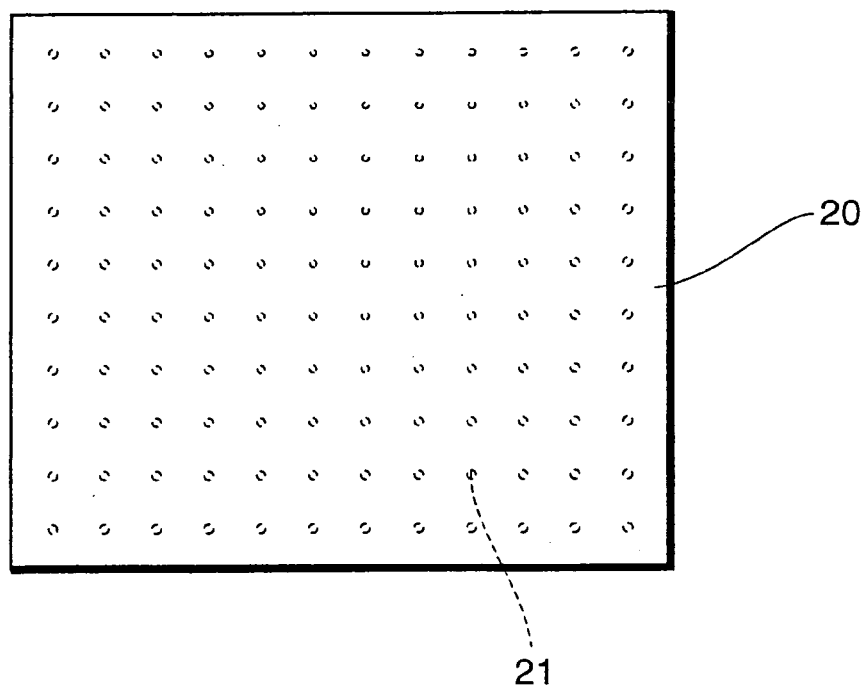
FIG. 12 is a front view of the mount substrate.

This mount substrate 20 is provided with a lot of through holes 21 extending from a mount surface for the image sensor assembly 1, to the back side thereof (see FIG. 12). These through holes 21 are located on intersections of grid lines extending at equal intervals, in the view from the mount surface side for the image sensor assembly 1. In the description hereinafter, the pitch as an interval between adjacent through holes 21 will be denoted by p. It suffices to provide these through holes 21 in the region where the image sensor assembly 1 is mounted, but they may also be formed in the entire surface outside the mount region. The size and arrangement of the through holes 21 are properly determined taking into account the strength and thickness of the mount substrate 20, and air permeability of the through holes 21. In the present embodiment, the diameter of the through holes 21 is set to be approximately 0.4 mm to 0.5 mm, and the pitch p 20 mm. As a result, there exist 11×8 through holes 21 on the mount surface (231 mm×184 mm) for the image sensor assembly 1.

An adhesive 30 is interposed between image sensor assembly 1 and mount substrate 20. This adhesive 30 is placed on approximately center locations between horizontally adjacent through holes 21, away from the through holes 21. Specifically, the adhesive 30 is located so as to extend on grid lines each shifted 0.5 p in two directions of extending directions of the grid lines from the grid lines on which the through holes 21 are placed. In the present embodiment, the adhesive 30 has the width of 1 mm and the thickness of approximately 0.5 mm. A preferred material for this adhesive 30 is an adhesive of an epoxy insulating resin such as Asahitite EX-29-5 available from Asahi Chemical Research Laboratory Co., Ltd.

The portion of moisture-proof protective film 18 reaching the second surface part of the image sensor assembly 1 is fixed between the adhesive 30 on the mount substrate 20 and the Si substrate 10 of the image sensor assembly 1, and is fixed as sandwiched between the mount substrate 20 and the Si substrate 10.

A bonding pad portion 22 is located in a region of mount substrate 20 where it faces the bonding pad portion 14 of image sensor assembly 1 in contiguity with image sensor assembly 1, and each pair of corresponding bonding pads are coupled to each other by a wire (wire bonding). A circuit section 24 where a processing circuit and others are placed is provided outside the mount region for image sensor assembly 1, of mount substrate 20, and the circuit section 24 is electrically coupled to corresponding bonding pads 22 by unrepresented wires. In the circuit section 24 there are provided output terminals of image signal, a power input terminal, and so on.

Figure 7:
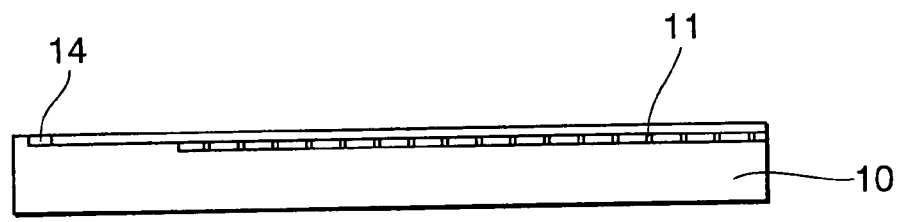
FIG. 7 to FIG. 11 are illustrations to illustrate steps of production of the radiation image sensor of FIG. 1.
Figure 8:
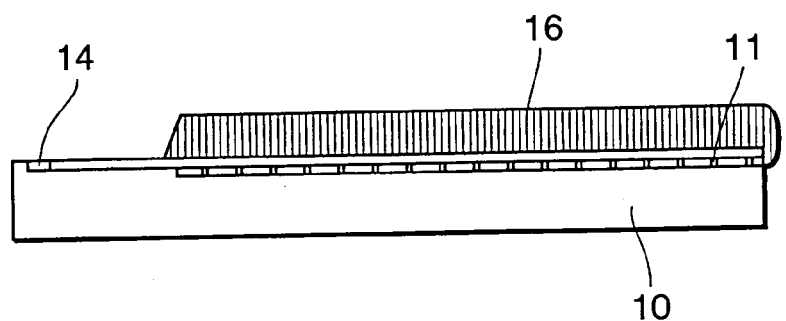
Figure 9:
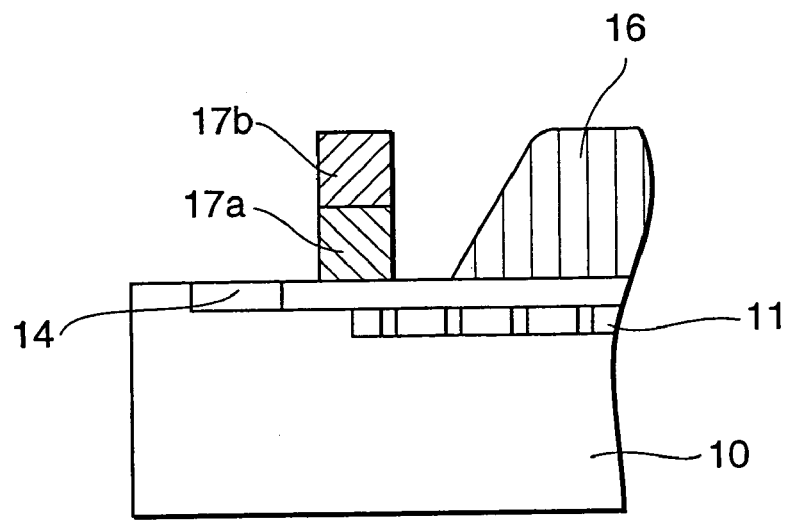

Next, a method of production of this radiation image sensor 100 will be specifically described with reference to FIGS. 7 to 15. First, as shown in FIG. 7, image sensor 1a is prepared in a form in which the light sensitive portion 11, shift register 12, charge amplifier array 13, and bonding pad portions 14 are formed on Si substrate 10. Here the light sensitive portion 11 is not located in the center of the Si substrate 10 but is located as displaced toward at least one specific edge side. This image sensor 1a can be fabricated, for example, by forming an integrated circuit on an Si wafer of 12 inches (about 30 centimeters) in diameter by a known technique using a stepper or the like, and thereafter cutting it into a desired size.

Next, the Si substrate 10 is placed with such a mask as to expose a region wider than the light sensitive portion 11, in a scintillator evaporation chamber, and the scintillator layer 16 is deposited thereon. Here the side wall part of Si substrate 10 in proximity to the light sensitive portion 11 is also exposed from the mask. A preferred example of the mask is an evaporation holder for holding the Si substrate 10 in an inverse state at portions along the three edges around the light sensitive portion 11. In this state, Tl and CsI vapors are introduced into the evaporation chamber to deposit and grow columnar crystals of CsI doped with Tl on the exposed portions of Si substrate 10 (vapor deposition). When the thickness of scintillator layer 16 thus evaporated reaches a desired thickness (e.g., 300 μm), the image sensor 1b with the scintillator layer 16 thereon (see FIG. 8) is taken out. By this, the scintillator layer 16 can be formed in uniform thickness over the entire surface on the light sensitive portion 11 up to the side wall portion 10c.

Then the resin layer 17 of the U-shaped frame opening on the side wall portion 10c side is formed so as to surround the scintillator layer 16. This resin layer 17 can be well formed by use of an automatic X-Y coating system such as AutoShooter-type 3 available from Iwashita Engineering, Inc. Here the resin layer 17 is made up in two-layer structure by forming a first layer 17a and thereafter forming a second layer 17b thereon, so as to secure the height (see FIG. 9). Here, in order to enhance adhesion of the moisture-proof protective film 18 formed in a subsequent step, it is preferable to roughen the upper surface of the second layer 17b. This roughening treatment can be a treatment of forming a number of lines or depressions in the surface.

Figure 10:
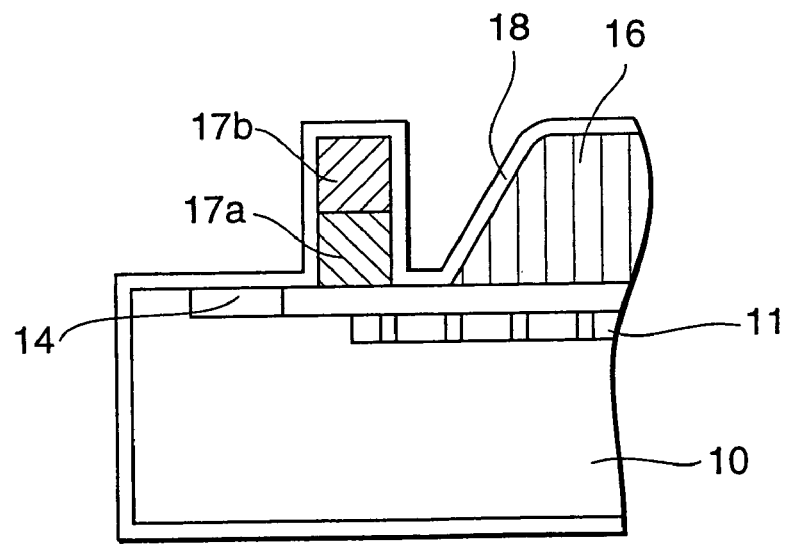
Figure 11:
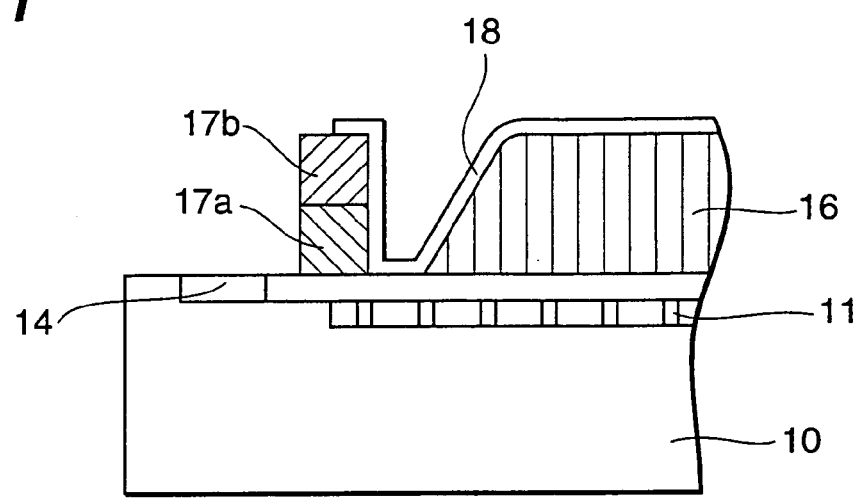

CsI forming the scintillator layer 16 is highly hygroscopic and, when kept exposed, it absorbs water vapor in air to dissolve (i.e., it has the deliquescence property). In order to protect the scintillator layer 16, as shown in FIG. 10, the image sensor 1b with the scintillator layer 16 thereon is thus almost completely coated with parylene in the thickness of 10 μm by CVD (chemical vapor deposition), to form the moisture-proof protective film 18.

Specifically, a coating is made by evaporation in vacuum in a manner similar to the vacuum evaporation of metal, and the method consists of a step of thermally decomposing a di-para-xylylene monomer as a raw material and quenching a product in an organic solvent such as toluene or benzene to obtain di-para-xylylene called a dimer, a step of thermally decomposing this dimer to produce a stable radical para-xylylene gas, and a step of making the evolving gas adsorbed and polymerized on a target material to form a poly-para-xylylene film having the molecular weight of about 500000 by polymerization.

There is a clearance between columnar crystals of CsI, and parylene goes into this narrow clearance to some extent. Therefore, the moisture-proof protective film 18 becomes closely fit to the scintillator layer 16, while hermetically sealing the scintillator layer 16. This parylene coating can form a precise thin-film coating in uniform thickness on the scintillator layer 16 with the surface having fine unevenness. Since the CVD formation of parylene can be carried out at room temperature in a lower degree of vacuum than in evaporation of metal, the process is easy.

The moisture-proof protective film 18 formed in this way is cut with cutter 50 along the longitudinal direction of the resin layer 17 (see FIG. 11), to remove the moisture-proof protective film 18 outside the cut part. Since the resin layer 17 forms the projected part, it becomes easier to visually recognize the target cutting part, a margin is given between the first surface 10a and cutter 50 by the degree of the thickness (height) of the resin layer 17 on the occasion of cutting with the cutter 50, and there is no risk of damaging unrepresented signal lines existing below the resin layer 17, so as to make the process easier. For this reason, the yield of products can be increased.

Thereafter, a coating of an acrylic resin is formed so as to cover the peripheral part of the cut part of the moisture-proof protective film 18 and the exposed resin layer 17, and the acrylic resin coating is cured by irradiation with ultraviolet rays to form the coating resin layer 19. At this time, on the side of side wall 10c of Si substrate 10, the coating is made on the portions of the peripheral edge of the moisture-proof protective film 18, the end faces of the resin layer 17 exposed adjacent thereto, and the side wall 10c. This results in obtaining the image sensor assembly 1 shown in FIGS. 3 to 6.

Then the mount substrate 20 with through holes 21 as shown in FIG. 12 is prepared, and adhesive 30 of an insulating resin is applied in a grid pattern on the mount surface for image sensor assembly 1, of the mount substrate 20. This application of adhesive 30 is preferably carried out using the aforementioned X-Y coating system, because the adhesive 30 can be applied accurately at the predetermined locations off the through holes 21.

Figure 13:
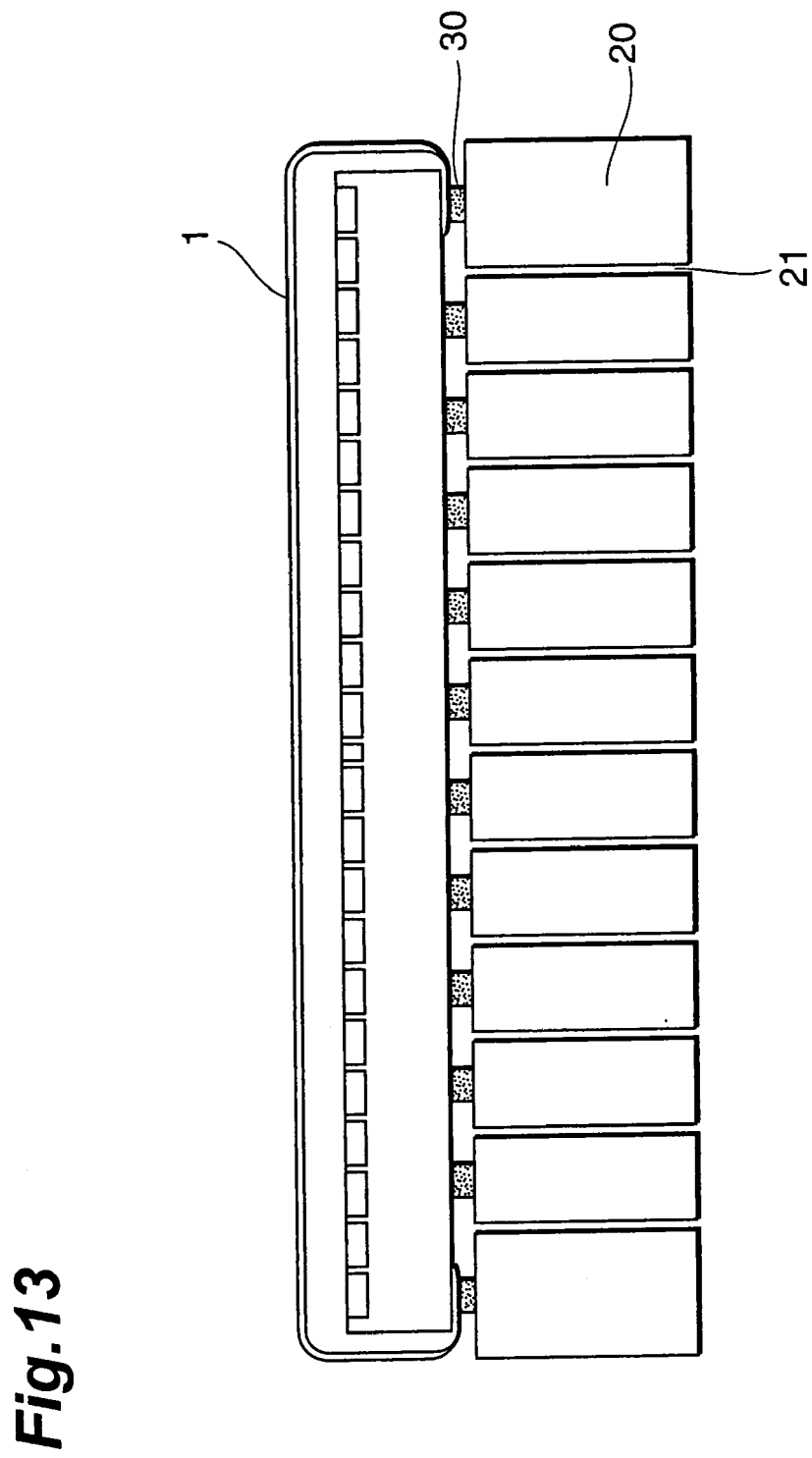
FIG. 13 is an illustration to illustrate a step of mounting the image sensor.
Figure 14:
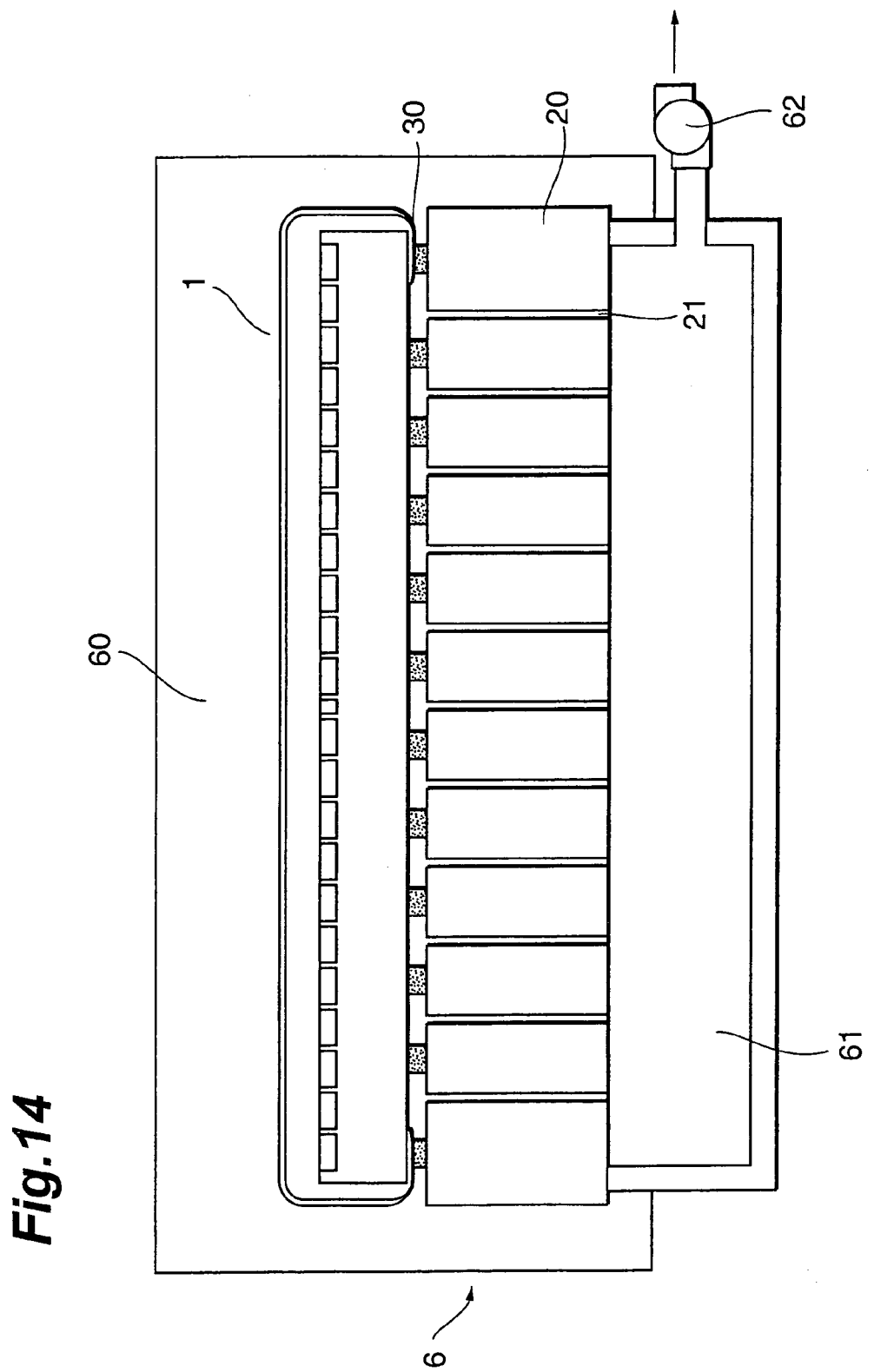
FIG. 14 is an illustration to illustrate a device used for mounting of the image sensor.

After completion of the application of the adhesive 30, the image sensor assembly 1 is mounted on the mount substrate 20 so that the second surface 10d thereof faces the mount surface of the mount substrate 20 (see FIG. 13), and in that state the mount substrate 20 is set in a device 6 as shown in FIG. 14. This device 6 has a configuration in which the mount substrate 20 separates a space 60 facing the upper side of the mount substrate 20 thus set, from a space 61 facing the lower side. This device is provided with a vacuum pump 62 for evacuating air in the lower space 61.

After the mount substrate 20 is set in the device 6, the vacuum pump 62 is actuated to depressurize the interior of the lower space 61. Since the through holes 21 of the mount substrate 20 are in communication with the lower space 61, the depressurization results in making the pressure on the side of second surface 10d of the image sensor assembly 1 lower than the pressure on the side of first surface 10a. The difference made between the pressures on the first surface 10a side and on the second surface 10d side in this way results in urging the image sensor assembly 1 against the mount substrate 20. This causes the adhesive 30 to spread thin between the image sensor assembly 1 and the mount substrate 20. In this state the adhesive 30 is cured to fix the image sensor assembly 1 to the mount substrate 20. After the fixing step, the corresponding bonding pads of the bonding pad portions 14, 22 are electrically coupled to each other by wires, to obtain the radiation image sensor 100 shown in FIGS. 1 and 2.

Since the radiation image sensor is fabricated in this manner wherein the pressure difference is made between the front and back faces of the image sensor assembly 1 by making use of the through holes 21 provided in the mount substrate 20 and wherein the image sensor assembly 1 is fixed while being urged against the mount substrate 20 by the generated pressure difference, there is no need for providing an extra space for the pressing on the surface of the image sensor assembly 1 (the first surface 10a) and the maximum area can be secured for the formation of the scintillator layer 16 in the image sensor assembly 1. For the light sensitive portion 11 of the same size, therefore, the area of the image sensor assembly 1 can be made smaller, so as to achieve downsizing of the radiation image sensor 100. Furthermore, since the entire surface of the image sensor assembly 1 can be urged against the mount substrate 20 with the substantially uniform force by the pressure difference, the flat plate nature of the light receiving surface can be secured while suppressing occurrence of flexure, distortion, warp, etc. even in the case where the large-area and low-profile image sensor assembly 1 is fixed. Furthermore, since no local force is applied to the scintillator layer 16, the scintillator layer 16 is prevented from being damaged during the fixing operation, and the yield of products is also increased.

Since the peripheral edge of the moisture-proof protective film 18 is sandwiched between the resin layer 17 and the coating resin layer 19 so as to be fixed on the three sides and the other edge goes over one side of the sensor substrate up to the back side to be also sandwiched between the sensor substrate and the mount substrate 20 so as to be fixed, it is feasible to effectively prevent peeling of the moisture-proof protective film 18. Particularly, by placing the image sensor assembly 1 a little inside the mount substrate 20 on the side wall 10*c* side, it is feasible to prevent an unnecessary force from being exerted on the moisture-proof protective film 18 on the side wall 10*c* during operation and to effectively suppress the peeling from this part.

In a case where the mount substrate 20 also has through holes 21 in the region outside the mount surface for image sensor assembly 1, it is necessary to preliminarily close the through holes 21 in that region. A method of closing these through holes 21 can be a method of covering these through holes 21 with an airtight film from the mount surface side, or a method of covering the through holes with an airtight panel, mask, or the like from the other side. By doing so, no direct communication is established through the through holes 21 between the upper space 60 and the lower space 61 in the device 6, so that the pressure difference can be surely generated between the two spaces 60, 61.

In the example herein the pressure difference was generated between the two spaces 60, 61 by depressurizing the lower space 61, but it can be generated by any other method as long as the pressure on the front side of the image sensor assembly 1 becomes higher than the pressure on the lower side. For example, as in a device 6*a* shown in FIG. 15, the pressure difference between the two spaces 60, 61 may be generated by providing a pump 63 for feeding a gas (e.g., air) into the upper space 60*a*, and pressurizing the gas in the upper space 60. Furthermore, the two methods may be used in combination to pressurize the interior of the upper space 60 and depressurize the interior of the lower space 61. In this case, it is also possible to implement the pressurization and depressurization with a single pump, by guiding the gas in the lower space 61 into the upper space 60. Another potential configuration without provision of the two spaces in the device is such that only one space 60 or 61 for pressurization or depressurization is provided and the other side is kept in an open state. The gas does not always have to be air, but can also be nitrogen or the like. The operation can be carried out while the device 6 or the device 6*a* is set in a nitrogen box.

Figure 16:
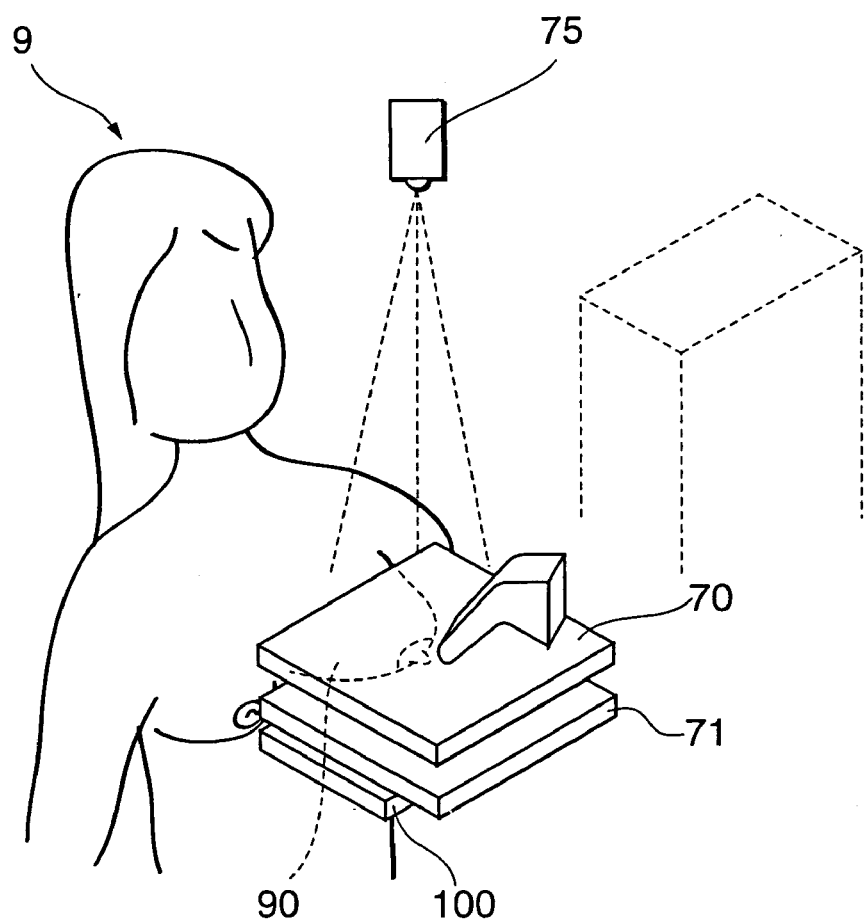
FIG. 16 is an illustration to illustrate mammography screening with the radiation image sensor according to the present invention.

Subsequently, the operation of the present embodiment will be described. In mammography screening, as shown in FIG. 16, the mammary 90 of a subject 9 is placed between two radiation-transparent plates 70, 71, and a transmitted image through the mammary 90 with X-rays emitted from radiation source 75 is taken by the radiation image sensor 100 of the present invention placed on the plate 71 side. At this time, the side wall portion 10*c* is placed on the body side of subject 9, so that the light sensitive portion 11 can be located in close proximity to the body part.

X-rays (radiation) through the mammary 90 constituting the transmitted X-ray image of mammary 90 pass through the plate 71 to enter the entrance surface of the radiation image sensor 100 (the front surface of moisture-proof protective film 18). The incident X-rays (radiation) travel through the moisture-proof protective film 18 to reach the scintillator layer 16 to be absorbed in the scintillator layer 16. The scintillator layer 16 radiates (or emits) light of a predetermined wavelength (the wavelength of 570 nm in the present embodiment) in approximate proportion to the quantity of absorbed X-rays.

The light emitted from the scintillator layer 16 in this way reaches the light sensitive portion 11 to be absorbed in each photodiode, and a charge according to the quantity of the absorbed light in each photodiode is accumulated for a fixed period (photoelectric conversion). Since the quantity of this light corresponds to the quantity of incident X-rays, an electric signal accumulated in each photodiode corresponds to the quantity of incident X-rays. Namely, an electric signal corresponding to a luminance of each pixel in the X-ray image (hereinafter referred to as an image signal of each pixel) is obtained in each photodiode.

By operating the MOSFET corresponding to each photodiode by the shift register 12, the charge of each photodiode (corresponding to an image signal of each pixel) is read out through an unrepresented signal line to the charge amplifier array 13, the read signal is amplified therein, and thereafter the amplified signal is fed from the bonding pad portion 14 of the image sensor assembly 1 to the corresponding bonding pad portion 22 on the mount substrate 20 side. The signal is then processed in the circuit section 24, and thereafter the processed signal is outputted as an image data signal of predetermined format from the output terminal. On the basis of this output signal, the X-ray image can be displayed on a monitor, or can be stored and preserved in a predetermined storage device.

In the radiation image sensor 100 of the present embodiment, the light sensitive portion 11 thereof spreads up to the vicinity of the side wall portion 10*c*, and it is thus feasible to image even the base part of the mammary 90. Since the flatness of the image sensor assembly 1 is ensured, an accurate X-ray image without distortion can be taken for the entire mammary 90. Since the moisture-proof protective film 18 is formed over the side wall near the body part to be sandwiched between the sensor substrate and the mount substrate 20, it is feasible to prevent the moisture-proof protective film 18 from being peeled off because of contact with the body, and to surely prevent sweat or water from intruding from the contact part and degrading the scintillator layer 16.

The present invention is also suitably applicable to a large-area image sensor fabricated by placing a plurality of image sensors on one base like tiles and interconnecting light receiving parts thereof. In order to minimize a non-sensitive region in the image sensor after interconnection, the light sensitive portion 11 needs to spread up to the border part. In the radiation image sensor having the light sensitive part up to the border part in this way, where the moisture-proof protective film 18 is placed over the border part to the back side, it is feasible to surely prevent the peeling and damage of the moisture-proof protective film 18.

Figure 17:
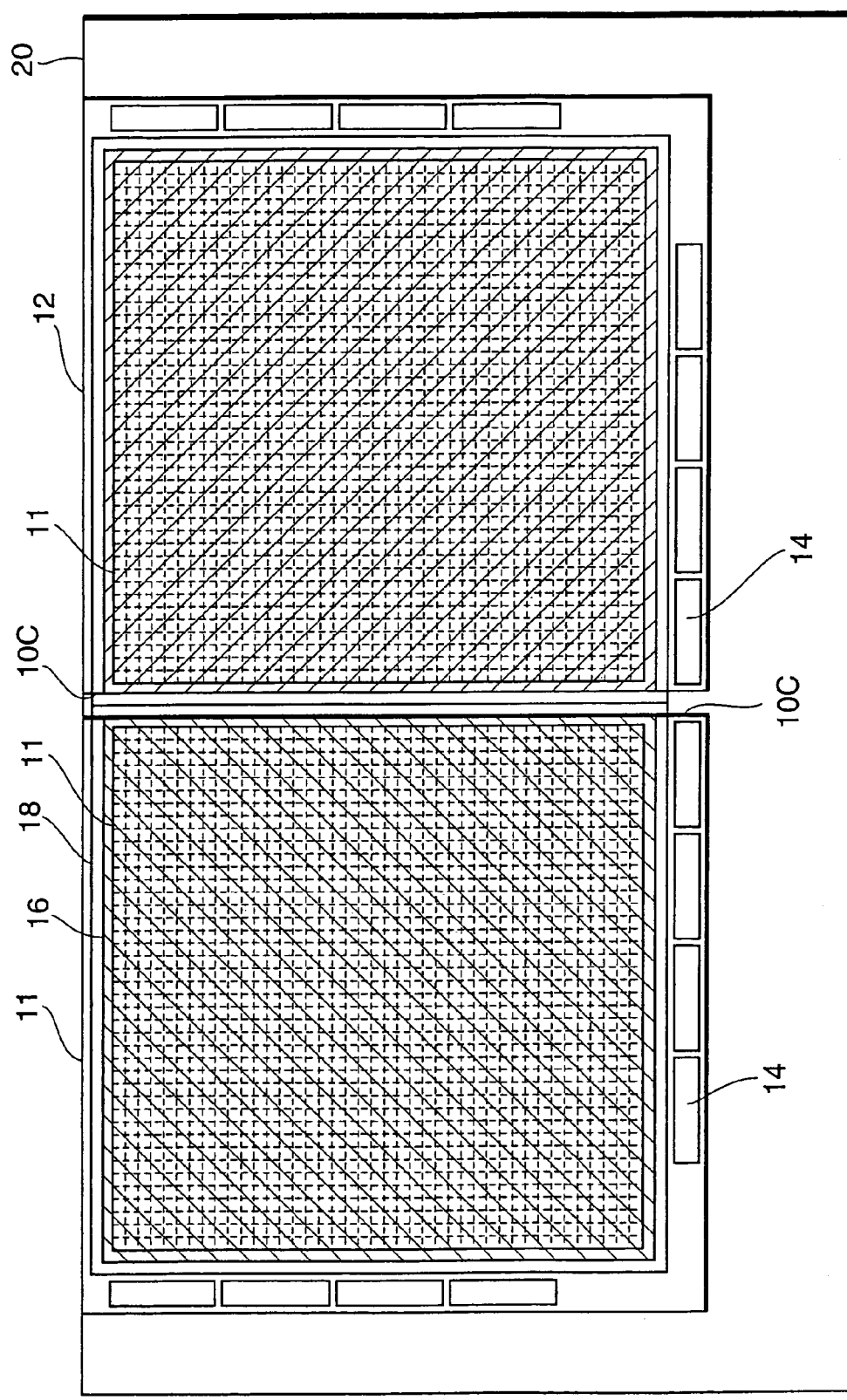
FIG. 17 is a plan view showing another form of the radiation image sensor according to the present invention.

FIG. 17 is a plan view showing an embodiment of such a large-area radiation image sensor. In this case, two image sensor parts 1$_1$, 1$_2$ are interconnected. Furthermore, three or more image sensor parts 1 may be arrayed on a line to implement a large screen, or image sensor parts may also be arranged in a 2×m array or in an m×n array to implement a large screen.

Figure 15:
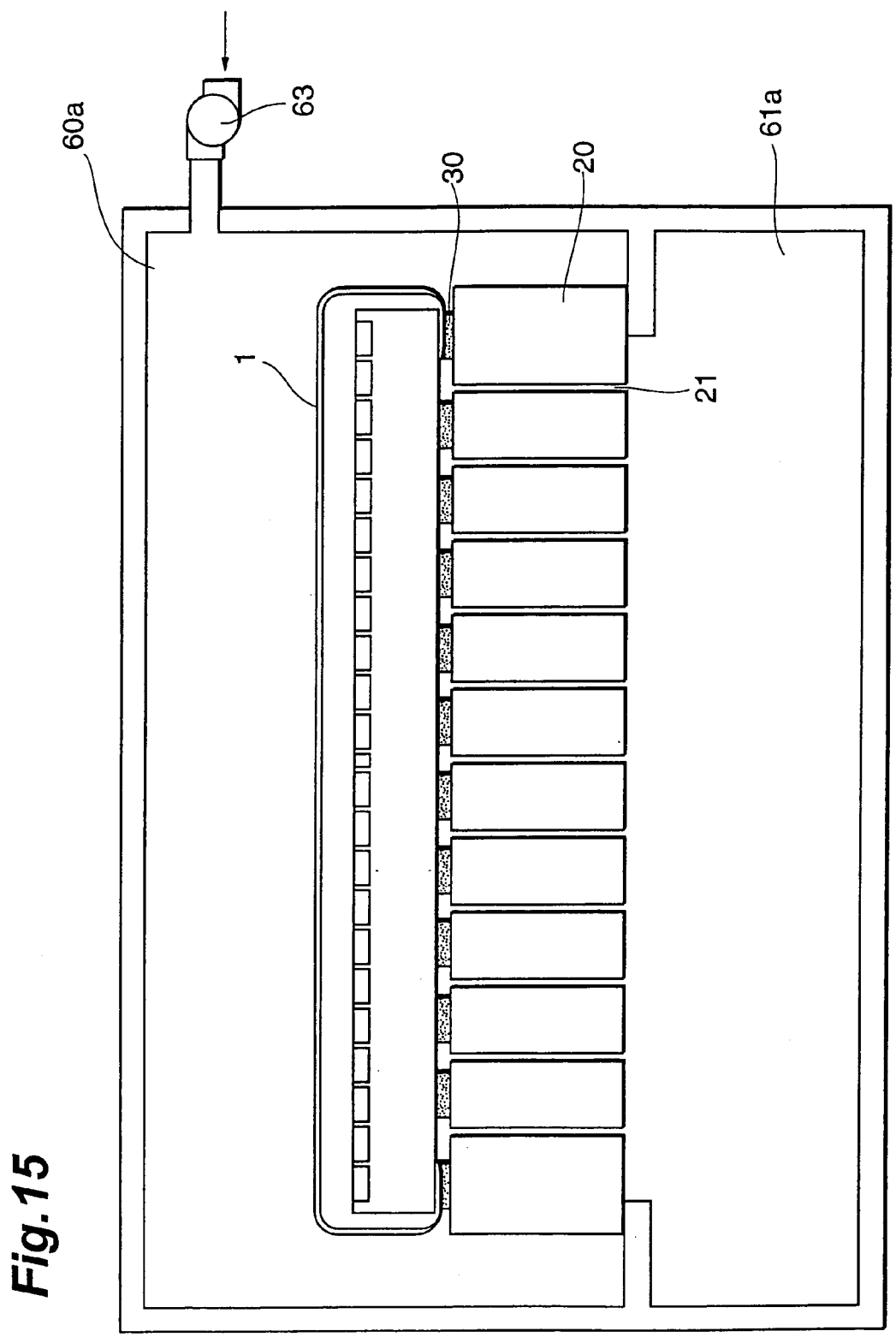
FIG. 15 is an illustration to illustrate another device used for mounting of the image sensor.
Figure 18:
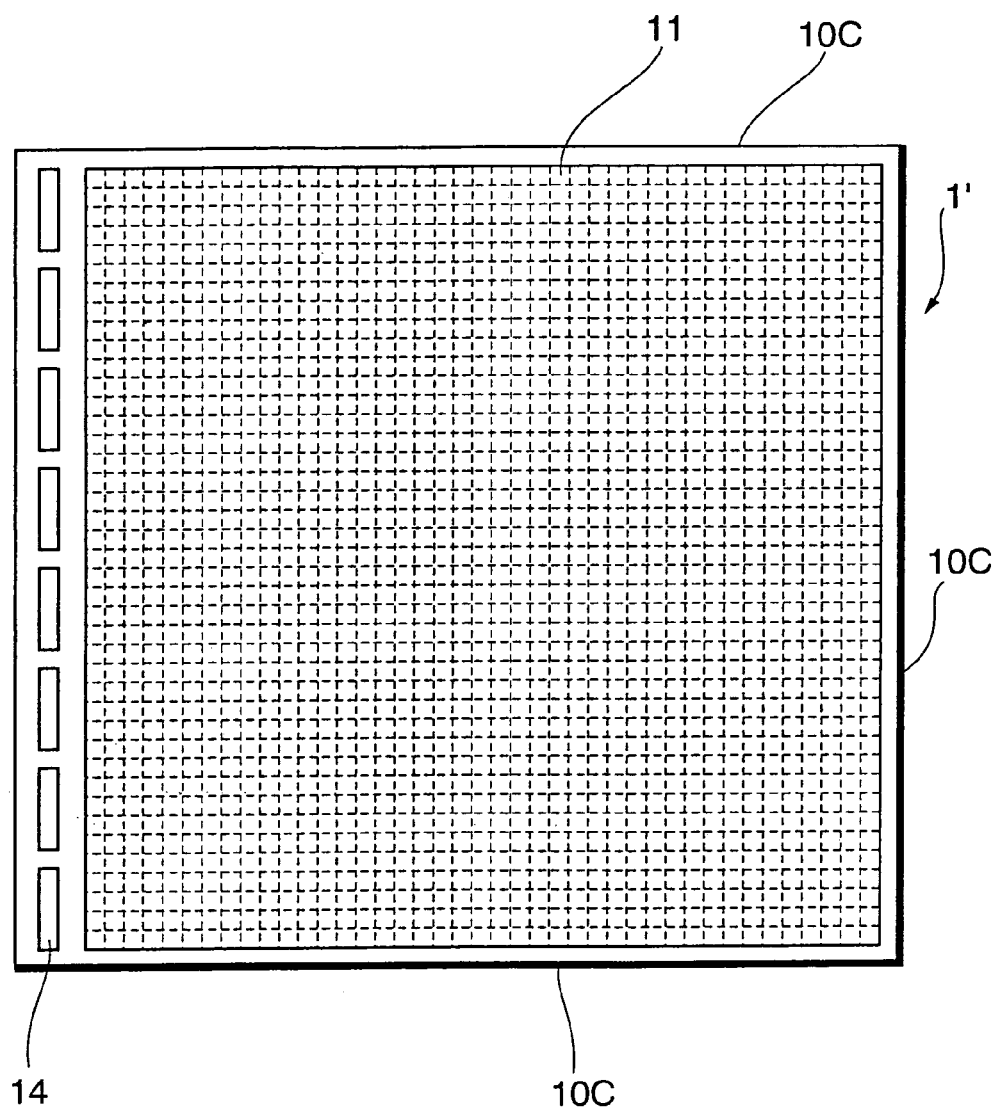
FIG. 18 and FIG. 19 are illustrations showing other forms of the image sensor assembly of the radiation image sensor according to the present invention.
Figure 19:
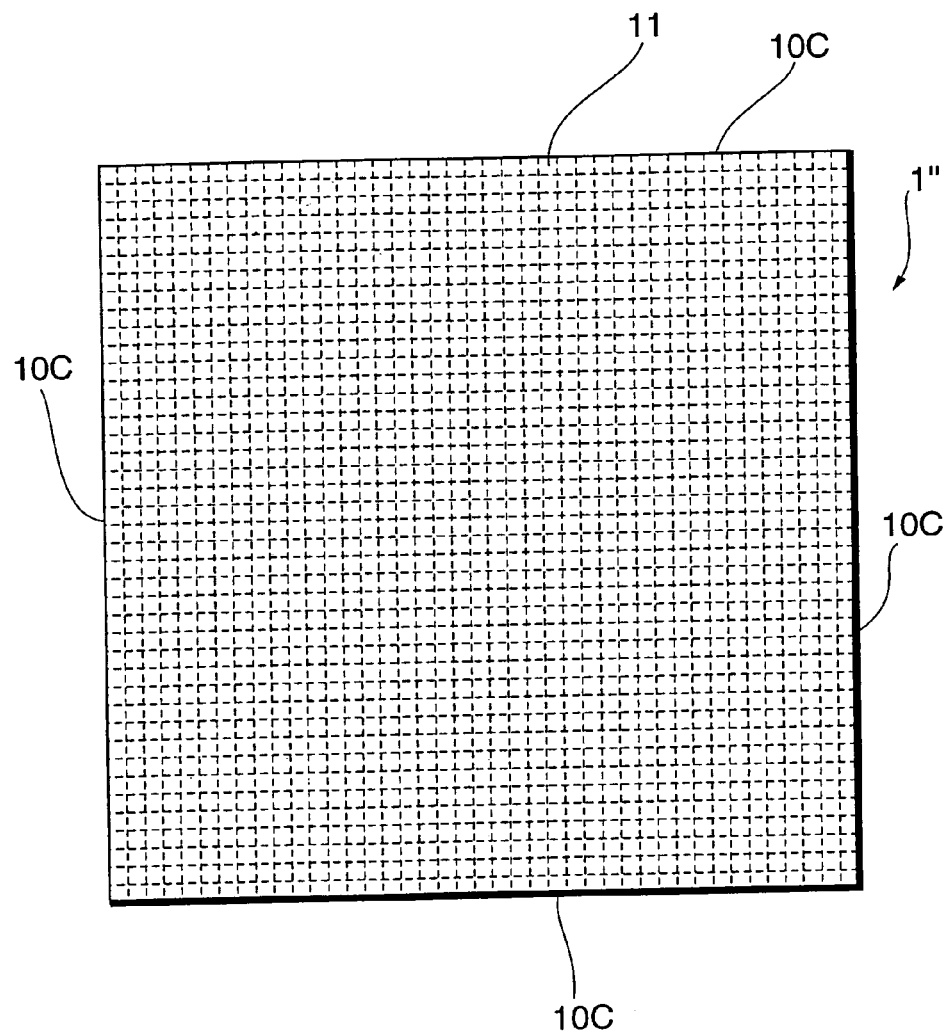

In a case where image sensor parts 1 are arranged in a 2×m array (where m is an integer of not less than 3), at least the image sensor parts 1' except for those located at the four corners need to have a structure in which the light sensitive portion 11 is laid up to the border parts of at least three edges (see FIG. 18). In this case, the moisture-proof protective film 18 is formed so as to extend over the side walls of these three edges up to the back side.

Where image sensor parts 1 are arranged in an m×n array (where m and n are integers of not less than 3), the image sensor parts 1" located in the central region further need to have a structure in which the light sensitive portion 11 is laid over the entire surface (see FIG. 19). In this case, the moisture-proof protective film 18 covers all the side walls and spreads up to the back side. However, it does not have to cover the entire back side. It is preferable to provide the electrode pads on the back side and to read signals by making use of wires penetrating the mount substrate 20. It is a matter of course that each image sensor assembly 1', 1" described above can also be used alone. FIGS. 13 to 15 each provided an example showing the production method, and, for simplification of illustration, the cross section of image sensor assembly 1 shows the case using the form wherein the light sensitive portion 11 is laid up to the border portions of at least one set of two opposing edges as shown in FIGS. 18 and 19.

Figure 20:
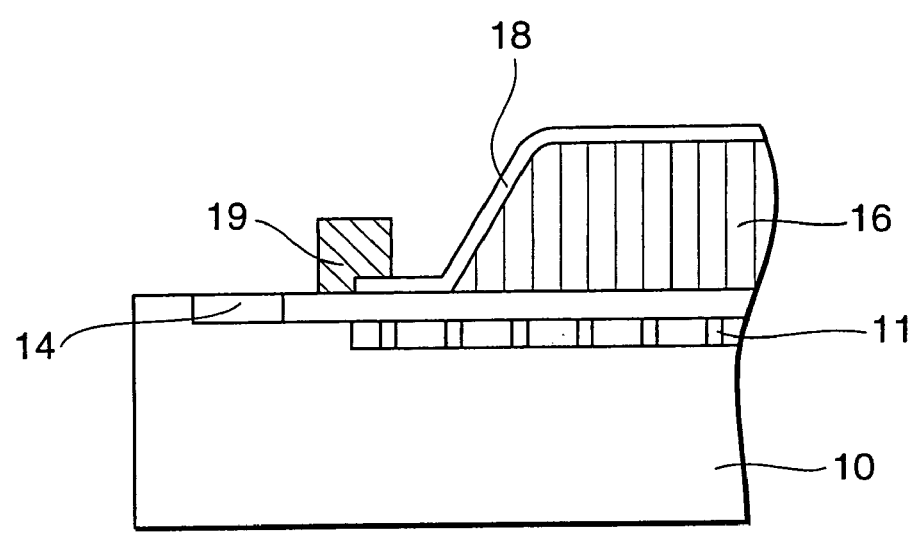
FIG. 20 is an illustration showing another form of the resin layer in the image sensor assembly of the radiation image sensor according to the present invention.

Here the fixing of the peripheral part of the moisture-proof protective film 18 is not always limited to the form in which the fixing is implemented by placing the peripheral part on the resin layer 17. For example, as shown in FIG. 20, the peripheral part of the moisture-proof protective film 18 is kept in direct contact with the first surface 10a of the image sensor part and a coating resin layer 19 is provided so as to cover the peripheral part, thereby protecting the peripheral part and preventing the moisture-proof protective film 18 from peeling off from the peripheral part. Another potential configuration is such that the moisture-proof protective film 18 is fixed by only the resin layer 17, without provision of the coating resin layer 19.

In the description above, the moisture-proof protective film 18 was described as a protective film of the single-film structure of parylene, but another potential configuration is such that a reflecting film of a metal thin film of Al, Ag, Au, or the like is provided on the surface of the parylene film so as to guide the light emitted from the scintillator layer 16, to the light sensitive portion 11, whereby an image with high luminance can be obtained. In order to protect this metal thin film, another parylene film or the like may also be provided on the surface of the metal thin film.

In the embodiments described above, the scintillator was that of CsI(Tl), but, without having to be limited to this, it is also possible to use CsI(Na), NaI(Tl), LiI(Eu), KI(Tl), and so on.

The term "poly-para-xylylene" in the above embodiments embraces poly-para-xylylenes and, in addition, poly-monochloro-para-xylylene, poly-dichloro-para-xylylene, poly-tetrachloro-para-xylylene, poly-fluoro-para-xylylene, poly-dimethyl-para-xylylene, poly-diethyl-para-xylylene, and so on.

What is claimed is:

1. A radiation image sensor in which an image sensor assembly is placed on a mount substrate,
    wherein said image sensor assembly comprises:
    a sensor substrate of flat plate shape having a first surface and a second surface as front and back sides;
    a light receiving portion comprising a plurality of photoelectric conversion elements two-dimensionally arranged on said first surface of said sensor substrate and in proximity to at least one edge thereof;
    a scintillator formed on at least a surface of said light receiving portion, and outputting light of a wavelength that can be detected by said photoelectric conversion elements, in accordance with an incident radiation;
    a resin layer placed in a surrounding area around said scintillator except for the edge to which said light receiving portion is in proximity, on said first surface of said sensor substrate; and
    a protective film continuously and integrally covering a region from a surface of said scintillator via a side wall part of said sensor substrate on a side of the edge to which said light receiving portion is in proximity, to said second surface, and having a peripheral part fixed on sides except for the edge to which said light receiving portion is in proximity, by said resin layer,
    wherein said protective film on said second surface is sandwiched between said mount substrate and said sensor substrate so as to be fixed.

2. The radiation image sensor according to claim 1, wherein said mount substrate has a plurality of through holes penetrating said mount substrate from a mount surface for said image sensor assembly, to a back side thereof.

3. The radiation image sensor according to claim 2, wherein said image sensor assembly is fixed on said mount substrate with an adhesive and wherein said adhesive is placed so as to surround said through holes.

4. The radiation image sensor according to claim 3, wherein said adhesive is placed in a grid pattern on said mount surface of said mount substrate for said image sensor assembly.

5. A making method of a radiation image sensor in which an image sensor assembly is placed on a mount substrate, the method comprising the steps of:
    preparing the image sensor assembly comprising a sensor substrate of flat plate shape having a first surface and a second surface as front and back sides, a light receiving portion comprising a plurality of photoelectric conversion elements two-dimensionally arranged on the first surface of the sensor substrate and in proximity to at least one edge thereof, and a scintillator deposited on at least a surface of the light receiving portion and outputting light of a wavelength that can be detected by the photoelectric conversion elements, in accordance with an incident radiation;
    forming a protective film continuously and integrally covering a region from a surface of the scintillator of the image sensor part via a side wall part of the sensor substrate on a side of the edge to which the light receiving portion is in proximity, to the second surface, and fixing a peripheral part of the protective film on sides except for the edge to which the light receiving portion is in proximity, by a resin layer placed in a surrounding area around the scintillator except for the edge to which the light receiving portion is in proximity, on the first surface of the sensor substrate; and
    fixing the image sensor part on the mount substrate in a state in which the protective film on the second surface of the image sensor part is sandwiched between the mount substrate and the sensor substrate, with the second surface of the image sensor part being directed toward a mount surface of the mount substrate.

* * * * *